(12) United States Patent
Ukawa et al.

(10) Patent No.: US 10,431,572 B2
(45) Date of Patent: Oct. 1, 2019

(54) LIGHT EMITTING DEVICE AND METHOD OF MANUFACTURING THE LIGHT EMITTING DEVICE

(71) Applicant: NICHIA CORPORATION, Anan-shi, Tokushima (JP)

(72) Inventors: Hiroaki Ukawa, Itano-gun (JP); Yusuke Hayashi, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/970,142

(22) Filed: May 3, 2018

(65) Prior Publication Data

US 2018/0331084 A1 Nov. 15, 2018

(30) Foreign Application Priority Data

May 12, 2017 (JP) .................................. 2017-095850

(51) Int. Cl.
*H01L 25/16* (2006.01)
*H01L 29/866* (2006.01)
(Continued)

(52) U.S. Cl.
CPC ........ *H01L 25/167* (2013.01); *H01L 25/0753* (2013.01); *H01L 29/866* (2013.01); *H01L 33/502* (2013.01); *H01L 33/52* (2013.01); *H01L 33/56* (2013.01); *H01L 33/60* (2013.01); *H01L 24/48* (2013.01); *H01L 33/54* (2013.01); *H01L 33/62* (2013.01); *H01L 2224/2929* (2013.01);
(Continued)

(58) Field of Classification Search
CPC ....... H01L 33/486; H01L 33/54; H01L 33/58; H01L 33/60; H01L 33/62; H01L 24/48; H01L 24/47
See application file for complete search history.

(56) References Cited

U.S. PATENT DOCUMENTS 3,623,649 A * 11/1971 Keisling ............. H01L 21/4853
228/111.5
2006/0267040 A1* 11/2006 Baek ..................... H01L 25/167
257/99

(Continued)

FOREIGN PATENT DOCUMENTS

JP 2005-123388 A 5/2005
JP 2007-227882 A 9/2007
(Continued)

*Primary Examiner* — Ermias T Woldegeorgis
(74) *Attorney, Agent, or Firm* — Foley & Lardner LLP

(57) ABSTRACT

A light emitting device includes: a base comprising a first lead, a second lead, and a supporting member; a light emitting element mounted on the first lead; a protection element mounted on the second lead; a wire including a first end and a second end, wherein the first end is connected to an upper surface of the first lead, and the second end is connected to a first terminal electrode of the protection element; a resin frame located on an upper surface of the base, wherein the resin frame covers at least part of the protection element and surrounds the light emitting element and the first end of the wire; a first resin member surrounded by the resin frame and covering the light emitting element and the first end of the wire; and a second resin member covering the resin frame and the first resin member.

12 Claims, 10 Drawing Sheets

(51) Int. Cl.
  *H01L 33/50* (2010.01)
  *H01L 33/52* (2010.01)
  *H01L 33/56* (2010.01)
  *H01L 33/60* (2010.01)
  *H01L 25/075* (2006.01)
  *H01L 33/62* (2010.01)
  *H01L 23/00* (2006.01)
  *H01L 33/54* (2010.01)

(52) U.S. Cl.
  CPC ............... *H01L 2224/29339* (2013.01); *H01L 2224/32145* (2013.01); *H01L 2224/48245* (2013.01); *H01L 2224/48247* (2013.01); *H01L 2224/48257* (2013.01); *H01L 2224/48458* (2013.01); *H01L 2224/48471* (2013.01); *H01L 2224/4912* (2013.01); *H01L 2224/73265* (2013.01); *H01L 2224/8592* (2013.01); *H01L 2224/92147* (2013.01); *H01L 2924/12035* (2013.01); *H01L 2924/12041* (2013.01); *H01L 2924/35121* (2013.01); *H01L 2933/005* (2013.01); *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 2007/0194422 A1 | 8/2007 | Lai et al. |
| 2008/0298063 A1 | 12/2008 | Hayashi |
| 2010/0084683 A1 | 4/2010 | Lai et al. |
| 2010/0264449 A1 | 10/2010 | Hayashi |
| 2011/0111082 A1 | 5/2011 | Hayashi |
| 2014/0203305 A1* | 7/2014 | Kawano ............... H01L 33/486 257/88 |
| 2014/0233239 A1 | 8/2014 | Matsuda et al. |
| 2014/0291716 A1 | 10/2014 | Ukawa |
| 2015/0189703 A1 | 7/2015 | Akazawa |
| 2015/0270450 A1 | 9/2015 | Kuroki et al. |
| 2016/0005942 A1 | 1/2016 | Ukawa |
| 2017/0194542 A1 | 7/2017 | Ukawa |

FOREIGN PATENT DOCUMENTS

| | | |
|---|---|---|
| JP | 2008-047712 A | 2/2008 |
| JP | 2008-300694 A | 12/2008 |
| JP | 2009-135496 A | 6/2009 |
| JP | 2009-200321 A | 9/2009 |
| JP | 2013-206895 A | 10/2013 |
| JP | 2014-145047 A | 8/2014 |
| JP | 2014-157920 A | 8/2014 |
| JP | 2014-209602 A | 11/2014 |
| JP | 2014-216329 A | 11/2014 |
| JP | 2015-128092 A | 7/2015 |
| JP | 2015-179777 A | 10/2015 |
| JP | 2017-076765 A | 4/2017 |

* cited by examiner

LIGHT EMITTING DEVICE AND METHOD OF MANUFACTURING THE LIGHT EMITTING DEVICE

CROSS-REFERENCE TO RELATED APPLICATION

This application claims priority to Japanese Patent Application No. 2017-095850, filed on May 12, 2017, the disclosure of which is hereby incorporated by reference in its entirety.

BACKGROUND

The present disclosure relates to light emitting devices, and methods of manufacturing light emitting devices.

A light emitting device in which a light emitting element, such as a light emitting diode, is mounted has high luminous efficiency, long service life, and is small, therefore being broadly used for various applications. For example, Japanese Unexamined Patent Application Publication No. 2013-206895 discloses a light emitting device including a base in which a first lead frame and a second lead frame are integrally formed with resin, and a light emitting element. The light emitting device disclosed in the aforementioned patent publication is produced by mounting a light emitting element on the first lead, connecting the light emitting element and the second lead, and thereafter encapsulating the light emitting element on the base. In the light emitting device disclosed in the aforementioned patent publication, a resin frame is provided on the base to stop the flow of an encapsulating resin when encapsulating the light emitting element. The above described structure can realize an optical semiconductor device having high heat dissipation and being highly resistant with low cost. Although not disclosed in JP No. 2013-206895, a protection element such as Zener diode is often mounted on the base together with the light emitting element in order to protect the light emitting element.

SUMMARY

In a light emitting device having a structure in which a protection element is mounted on a base together with a light emitting element, however, an area where the light emitting element is to be mounted is narrowed to provide an area where the protection element is mounted. As a result, the ability to reduce the size of the light emitting device is limited. There is also a need to improve the bonding strength of a wire for electrically connecting the protection element. For example, during a manufacturing step, the wire that electrically connects the protection element is subject to an external force, and the wire may be broken, resulting in a lower manufacturing yield.

One object of the light emitting device according to the present disclosure is to achieve a light emitting device that is reduced in size, in which an area where the light emitting element is mounted is less likely to be narrowed while a protection element is mounted on a base together with the light emitting element. Another object is to provide a method of manufacturing the light emitting device in which a light emitting device is reduced in size, and in which the area where the light emitting element is mounted is less likely to be narrowed while achieving good manufacturing yield.

According to one embodiment, a light emitting device includes a base including a first lead, a second lead, and a supporting member electrically isolating and supporting the first lead and the second lead, a light emitting element, a protection element including terminal electrodes, a wire including a first end and a second end, a resin frame provided on the upper surface of the base, a first resin member surrounded by the resin frame and covering the light emitting element and the first end of the wire, and a second resin member covering the resin frame and the first resin member. The first lead has an upper surface also referred to as a first surface, the second lead has an upper surface also referred to as a second surface, and the base has an upper surface as a third surface. The light emitting element mounted on the first surface. The protection element mounted on the second surface. One of the terminal electrodes of the protection element is referred to as a first terminal electrode and the other one is referred to as a second terminal electrode. The first end is connected to the first surface, and the second end is connected to one of the terminal electrodes of the protection element. The resin frame covers at least part of the protection element and surrounds the light emitting element and the first end of the wire.

According to another embodiment, a method of manufacturing a light emitting device includes: providing a base including a first lead, a second lead, and a supporting member electrically isolating and supporting the first lead and the second lead; wherein the first lead has a first surface, the second lead has a second surface, and the base has an upper surface as a third surface; mounting a light emitting element on the first surface; mounting a protection element on the second surface, the protection element including terminal electrodes; connecting the protection element and the first surface via a wire in such a manner as to connect a first end of the wire to the first surface, and to connect a second end of the wire to one of the terminal electrodes of the protection element; disposing a resin frame while being separated from the light emitting element and the first end of the wire, disposing a first resin member to cover the light emitting element and the first end of the wire; and disposing a second resin member to cover the resin frame and the first resin member.

According to certain embodiments of the present disclosure, a light emitting device that is reduced in size can be achieved with a structure in which a light emitting element and a protection element are mounted on a base while the area where the light emitting element is mounted is less likely to be narrowed.

According to certain embodiment of the present disclosure, a method of manufacturing a light emitting device can be achieved with a good manufacturing yield, while the area where a light emitting element is less likely to be narrowed.

DETAILED DESCRIPTION

Embodiments according to the present disclosure will be described below with reference to the drawings, as appropriate. The embodiments are intended to be illustrative of a light emitting device and a method of manufacturing the light emitting device, and to give a concrete form to technical ideas of the present invention. However, the scope of the invention is not limited to the embodiments described below. Configurations described in one embodiment can also be applied in other embodiments unless specifically indicated. Further, in the description below, the same designations refer to the same or similar members, and duplicative descriptions will be appropriately omitted.

The sizes and the positional relationships of the members in of the drawings are occasionally exaggerated or omitted for ease of explanation.

Figure 1A:
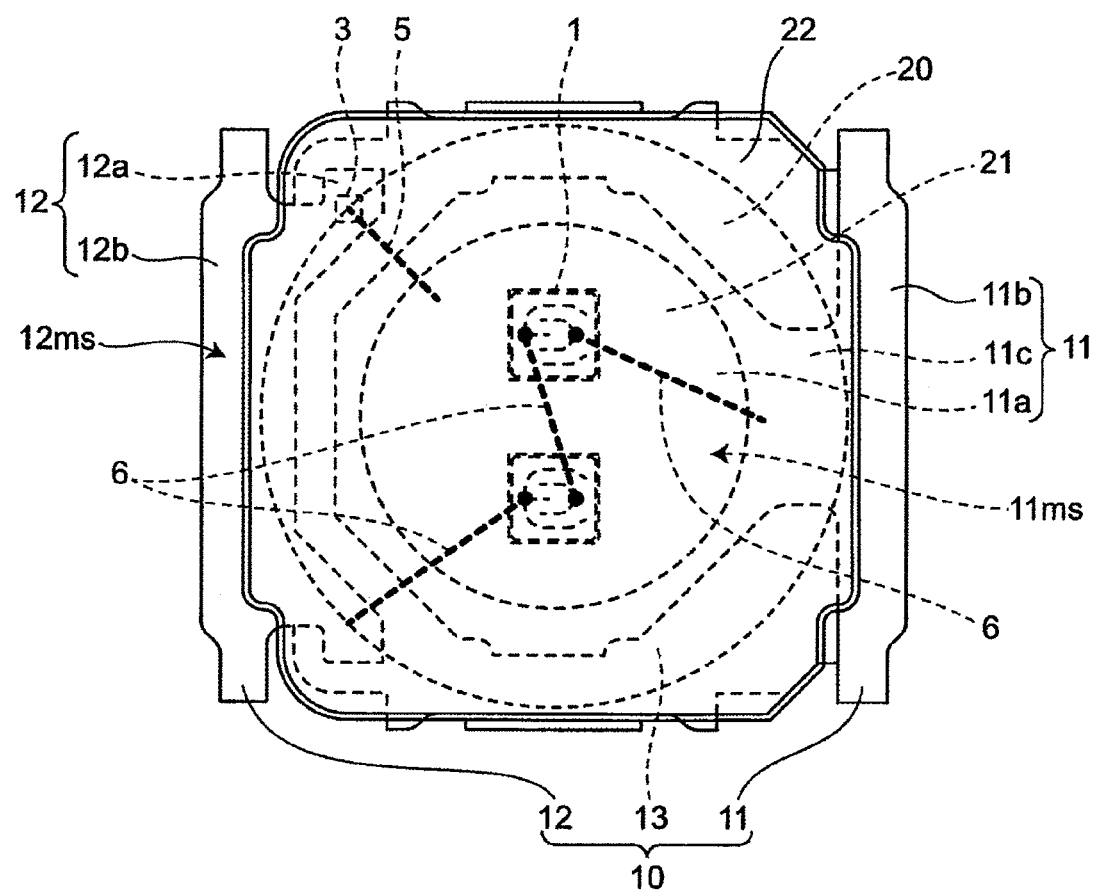
FIG. 1A is a schematic plan view showing a configuration of a light emitting device according to an embodiment of the present disclosure.
Figure 1B:
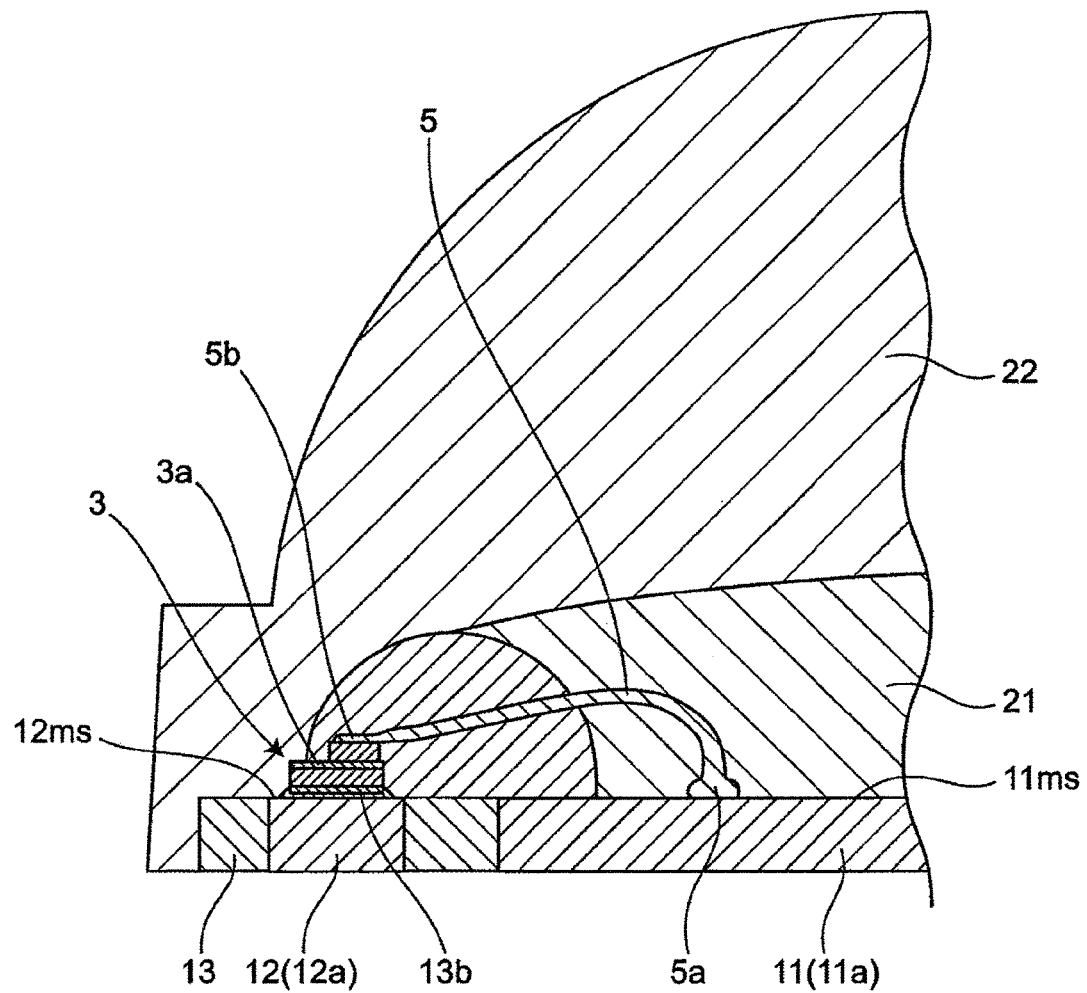
FIG. 1B is a schematic partial sectional view showing a part of a light emitting device according to an embodiment.

FIG. 1A is a schematic plan view showing a structure of a light emitting device according to an embodiment of the present disclosure. FIG. 1B is a partial enlarged sectional view showing a part of a light emitting device according to this embodiment of the present disclosure.

The light emitting device according to this includes a base 10, at least one light emitting element 1, and a protection element 3 mounted on the base. The base 10 includes a first lead 11, a second lead 12, and a supporting member 13 that supports and electrically isolates the first lead 11 and the second lead 12. The light emitting device according to this embodiment includes two light emitting elements 1. The two light emitting elements 1 are mounted on the first surface 11ms that is an upper surface of the first lead 11. Single or plurality of the light emitting elements may be mounted in the light emitting device. The protection element 3 is mounted on a second surface 12ms that is an upper surface of the second lead 12. The first surface 11ms of the first lead 11, the second surface 12ms of the second lead 12, and a third surface that is an upper surface of the supporting member 13 is substantially flash with each other, configuring a surface of the base 10. This can make the base 10 thin, thereby enabling achievement of a thin light emitting device.

The light emitting device according to the present embodiment includes the two light emitting elements each having a lower surface and an upper surface on which an n-electrode and a p-electrode are formed. The lower surface of each of the light emitting elements 1 are connected to the first surface 11ms of the first lead 11, and fixed on the first lead 11. The n-electrode formed on one of the light emitting elements 1 is electrically connected to the first lead 11 via one of the wires 6. The p-electrode formed on the one of the light emitting elements 1 is electrically connected to an n-electrode of the other one of the light emitting element 1 via another one of the wires 6. The p-electrode of the other one of the light emitting element 11 is electrically connected to the second lead 12 via yet another wire 6. Accordingly, the two light emitting elements 1 are serially connected between the first lead 11 and the second lead 12 of the base 10.

The protection element 3 in the light emitting device of the present embodiment is, for example, a Zener diode that includes a terminal electrode 3a also referred to as a first terminal electrode (e.g., cathode electrode) and a terminal electrode 3b also referred to as a second electrode (e.g., anode electrode). The protection element 3 is electrically connected to the second lead such that the terminal electrode 3b on the lower surface of the protection element 3 is fixed on the second surface 12ms of the second lead 12 via, for example, electric-conductive bonding member 8. The terminal electrode 3a (e.g., cathode electrode) of the protection element 3 is electrically connected to the first lead 11 via a wire 5. The wire 5 includes a first end and a second end. The first end is a portion of the wire 5, the portion being connected to the first surface 11ms. The second end is a portion of the wire 5, the portion being connected to the terminal electrode of the protection element 3. The protection element 3 is connected in parallel to the two light emitting elements 1 that are in series connection between the first lead 11 and the second lead 12 on the base 10.

The light emitting device includes a resin frame 20 disposed on the base 10 and covering at least part of the protection element 3. The resin frame 20 surrounds the two light emitting elements 1 and the first end 5a of the wire 5 that is the end of the wire 5 close to the first lead 11 and connects the terminal electrode 3a (e.g., cathode electrode) of the protection element 3 to the first lead 11. The light emitting device in the present embodiment includes the first resin member 21 and the second resin member 22. The first resin member 21 is surrounded by the resin frame 20, and covers the two light emitting elements 1 and the first end 5a of the wire 5. The second resin member 22 covers the resin frame 20 and the first resin member 21. The first resin member 21 and the second resin member 22 mainly contain a light transmissive resin. The second resin member 22 is formed in a lens shape, and controls the light distribution characteristic of the light emitting device.

In the light emitting device, the resin frame 20 is disposed on the base 10 so as to cover at least part of the protection element 3, thereby alleviating reduction in the area where the light emitting elements 1 caused by keeping the area where the protection element 3 is mounted. The resin frame 20 surrounds the first end 5a of the wire 5 that connects the terminal electrode 3a of the protection element 3 and the first lead 11. The first resin member 21 covers the first end 5a, thereby enabling achievement of high reliability in connection between the first lead 11 and the first end 5a. This can alleviate breakage of the wire 5 even if an external force is applied to the light emitting device in the manufacturing steps. Thus, the manufacturing yield of the light emitting device is less likely to be reduced. The light emitting device of the present embodiment can achieve downsizing of the light emitting device, and can mitigate reduction in the manufacturing yield thereof, while having a structure in which the protection element 3 and the light emitting elements 1 are mounted on the upper surface of the base 10.

The resin frame 20 is preferably formed by using a resin with a hardness greater than a hardness of a resin used to form the first resin member 21 and the second resin member 22. The light emitting device of the present embodiment includes the resin frame 20 to surround the two light emitting elements 1 and the first resin member 21 covering the first end 5a of the wire 5. Accordingly, the light emitting device of the present embodiment has a double structure in which the first resin member 21 and the second resin member 22 are overlapped against an external force applied from a lateral side of the light emitting device. This double structure can alleviate the external force applied from the lateral side of the light emitting device to the light emitting elements or wires, compared to a light emitting device without the resin frame 20.

The resin frame 20 of the light emitting device in the present embodiment is formed by using a resin with the hardness greater than the hardness of a resin used to form the first resin member 21 and the second resin member 22. With the resin frame 20 having greater hardness, the first resin member 21 is less likely to be deformed, even if the external force is applied to the light emitting device from its lateral side. This can prevent or inhibit the first end 5a from being subject to the external force, thereby enabling reduction in occurrence of wire breakage. Making the resin frame 20 harder enable more appropriate selection of a resin used for the first resin member 21 and the second resin member 22.

The first resin member 21 and the second resin member 22 are sometimes required to have a high light transmissivity and a tendency not to be discolored. Thus, high light transmissivity and low discoloration can be a priority to select a resin for forming the first resin member 21 and the second resin member 22. If the first resin member 21 and the second resin member 22 have insufficient function of protection from external force, a resin having greater hardness can be used for the resin frame 20 to protect the light emitting elements and the wires from external force.

Examples of the resin having high light transmissivity and capable of maintaining high light transmissivity with less discoloration include dimethyl silicone resin and phenyl silicone resin that has a hardness greater than a hardness of the dimethyl silicone resin.

The second resin member 22 is preferably formed by using a resin having hardness greater than the hardness of the first resin member 21. As described above, the second resin member 22 positioned outside is formed by using the resin having a hardness greater than the resin of the second resin member 21, and therefore can effectively protect the light emitting elements 1 and the connecting part thereof. For example, the first resin member 21 and the second resin member 22 are both formed by using dimethyl silicone resins that have high light transmissivity with less discoloration and each have a different hardness to each other. The first resin member 21 is formed by using a resin, for example, a dimethyl silicone resin having a hardness in a range of from A20 to A40 of durometer hardness in accordance with JIS K 7215. The second resin member 22 is formed by using a resin, for example, a dimethyl silicone resin having a hardness in a range of from A55 to A70 of durometer hardness in accordance with JIS K 7215.

In the case in which the resin frame 20 is formed by using a resin having a hardness greater than the resin of the first resin member 21 and the second resin members 22, the resin frame 20 is formed, for example, by using a phenyl silicone resin having a hardness in a range of from D28 to D53 of durometer hardness in accordance with JIS K 7215.

The first end 5a of the wire 5 preferably has a ball shape having a diameter larger than a diameter of a wire 5. As a commonly used conventional wire bonding technique, there is a ball/wedge bonding technique in which a first bonding is performed by a ball bonding and a second bonding is performed by a wedge bonding, for example, by using Au wire. In the ball/wedge bonding technique, a bonding strength of a bonded part by the ball bonding technique is weaker than a bonding strength of a bonded part by the wedge bonding. Therefore, in the bonding the wire 5 between the terminal electrode 3a of the protection element 3 and the first lead 11, the bonding between the first lead 11 and the wire 5 is performed by ball bonding (e.g., first bonding). The part bonded by the ball bonding is doubly covered by the first resin member 21 and the resin frame 20, thereby allowing an external force applied form the lateral side of the light emitting device to less likely to transmit inside thereof. Accordingly, the bonded part by the ball bonding is less likely to be peeled from the first lead 11.

As shown in FIG. 1B, the second end 5b of the wire 5 has a thickness smaller than the diameter of the wire 5, and is connected to the terminal electrode 3a via a bump 4 that is disposed on the terminal electrode 3a. The bonded part between the terminal electrode 3a formed on the upper surface of the protection element 3 and the wire 5 is covered by the resin frame 20, and is positioned relatively close to an outer edge of the light emitting device. Accordingly, the second end 5b is likely to be subject to an external force applied from the lateral side. In consideration thereof, the bonding between the wire 5 and the terminal electrode 3a formed on the upper surface of the protection element 3 is performed by the wedge bonding technique which can achieve higher bonding strength than the boll bonding technique. The second end 5b of the wire 5 preferably has the thickness smaller than the diameter of the wire 5. This can improve the bonding strength between the wire 5 and the terminal electrode 3a of the protection element, resulting in reduction in breakage of the wire 5. The wedge bonding technique applies greater load on the protection element 3 as compared to the ball bonding technique. It is thus preferable that the bump 4 is formed on the terminal electrode 3a of the protection element 3 and the wire 5 is formed on the bump 4 by the wedge bonding technique.

The second end 5b connected on the terminal electrode 3a of the protection element 3 by the wedge bonding technique is preferably embedded in the resin frame 20 in order to protect the bonded part.

The upper surface of the base 10 positioned inside the resin frame 20 preferably consists only of the upper surface of the first lead 11. With this structure, the supporting member 13 formed by using a resin and being high light absorption is, for example, less likely to be exposed on the upper surface of the first lead 11 inside the resin frame 20, thereby enabling high light extraction efficiency.

Part of the protection element 3 can be exposed outside the resin frame 20. The second resin member 22 preferably covers the part of the protection element 3 exposed from the resin frame 20. For example, an outline of the light emitting device can be a rectangular in the top view, the protection element 3 is mounted in the corner of the light emitting device, and then the protection element 3 can be partially exposed from the outer edge of the resin frame 20 while covering the exposed part of the protection element 3 by the second resin member 22. This can make the outline of the resin frame 20 small while protecting the protection element 3, thereby enabling achievement of a small light emitting device.

A method of manufacturing the light emitting device according to the present embodiment is described below.

The method of manufacturing the light emitting device includes providing the base, mounting at least one of the light emitting element, mounting the protection element, wiring, forming the resin frame, forming the first resin member, and forming the second resin member. The method of manufacturing the light emitting device according to the present embodiment in an exemplary order of the manufacturing steps is described below.

1. Providing Base

The plurality of bases 10 are produced in a state that the bases 10 are collectively linked to one another. Each of the bases 10 includes the first lead 11, the second lead 12, and the supporting member 13 supporting the first lead 11 and the second lead 12. In the description of the method of manufacturing the light emitting device, individual bases 10 are each referred to as an unit area 210.

1-1. Providing Lead Frame

Figure 2:
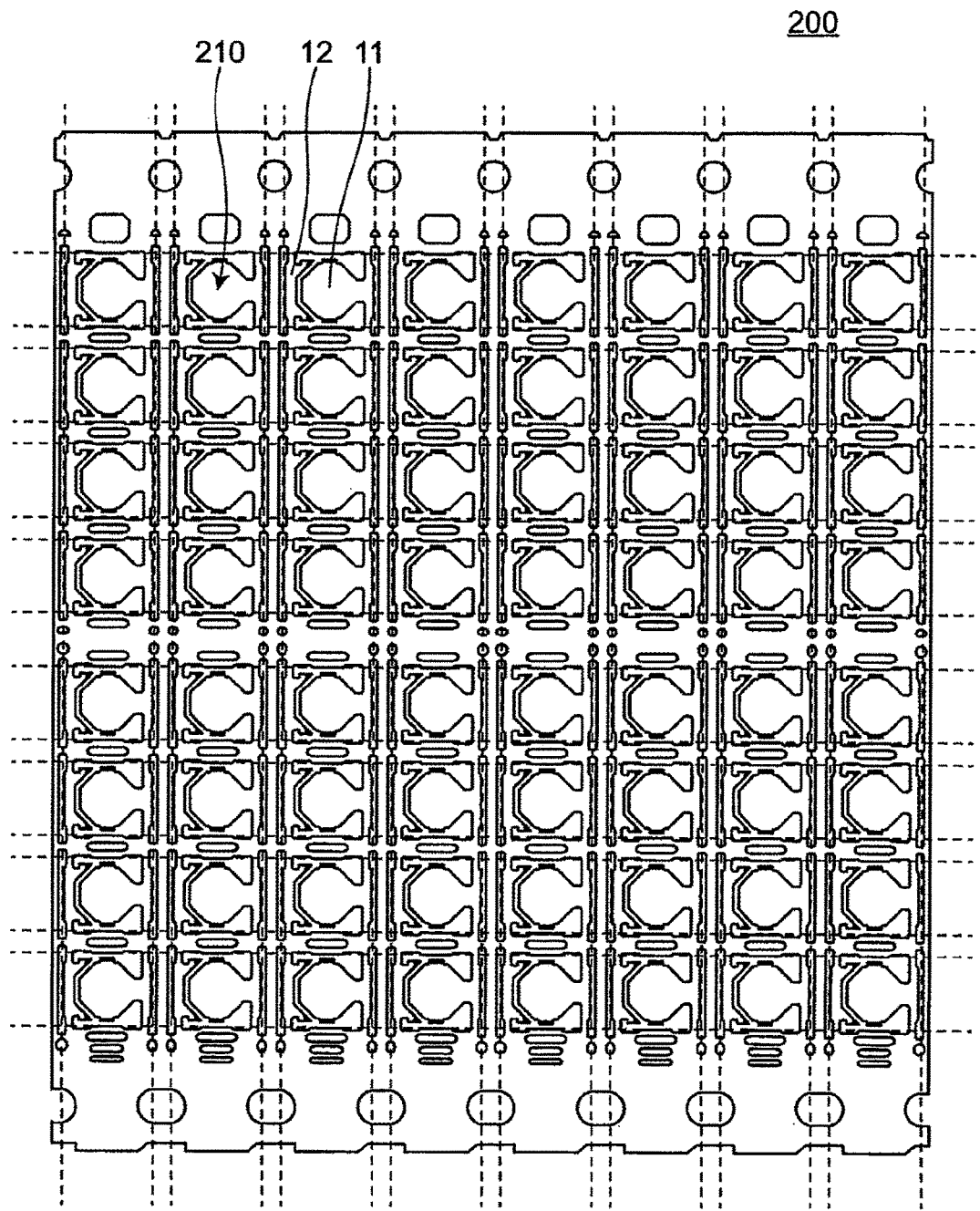
FIG. 2 is a schematic sectional plan view showing a lead frame used for manufacturing a base 10 in a method of manufacturing a light emitting device according to an embodiment of the present disclosure.

As shown in FIG. 2, a lead frame 200, in which unit area 210 are repeatedly arranged in eight rows and eight columns, is provided. Each of the unit areas 210 includes the first lead 11 and the second lead 12.

The lead frame 200 is described in detail below with reference to FIGS. 2 and 3A to 3D. FIGS. 3A to 3D, 4A to 4D, 5A, 6A, 7A, and 8A referred for description below show enlarged view of one of the unit areas 210.

The lead frame 200 is produced by processing, for example, a metal plate such as aluminum, iron, nickel, copper, copper alloy, stainless steel, iron alloy including Invar alloy. The lead frame 200 can be processed in a predetermined shape, for example, by etching, pressing, or grinding. The lead frame 200 has a thickness in a range of from, for example, 200 μm to 300 μm, and preferably in a range of from 230 μm to 280 μm.

Figure 3A:
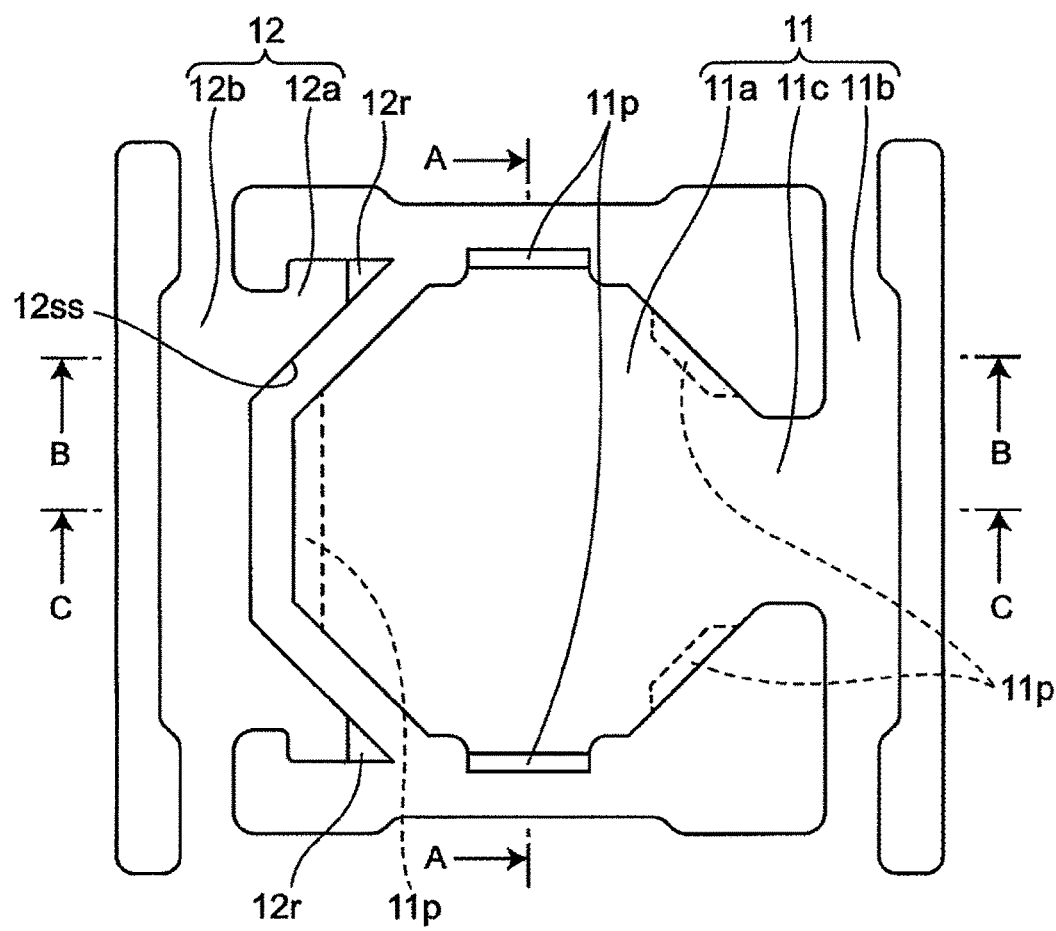
FIG. 3A is a schematic enlarged plan view showing an unit area of lead frames in FIG. 2.
Figure 3B:
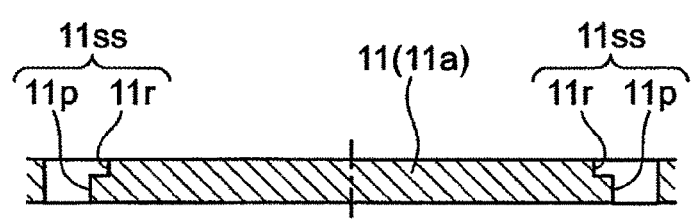
FIG. 3B is a schematic sectional view taken along line A-A of FIG. 3A.
Figure 3C:
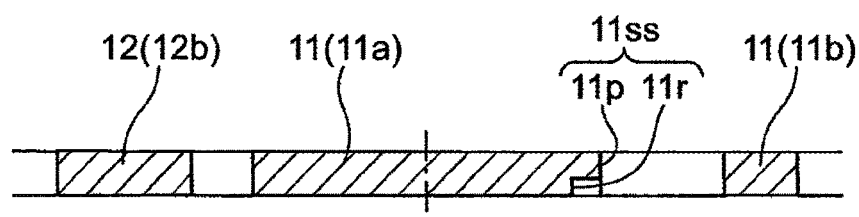
FIG. 3C is a schematic sectional view taken along line B-B of FIG. 3A.
Figure 3D:
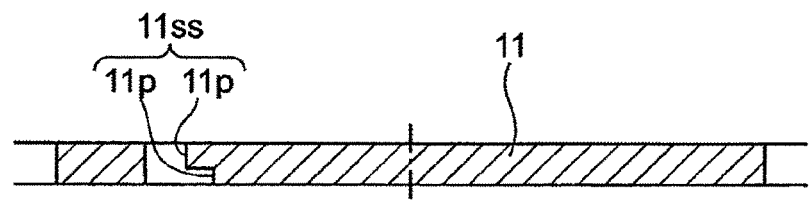
FIG. 3D is a schematic sectional view taken along line C-C of FIG. 3A.

As shown in FIG. 3A, the first lead 11 includes a main portion 11a having a substantially octagonal shape in a top view, and a terminal portion 11b extending along a side of the unit area 210, and a connection portion 11b connecting the main portion 11a and the terminal portion 11b. As shown in FIG. 3A, the second lead 12 includes a terminal portion 12b extending along the opposite side of the aforementioned side of the unit area 210, and extending portions 12a that each have a substantially triangle shape and each extend along the main portion 11a of the first lead 11 from both ends of the terminal portion 12b. The second lead 12 having such structure is provided with substantially constant interval between the second lead 12 and three sides of the substantially octagonal main portion 11a positioned close to the second lead 12.

The lead frame 200 is supported by the supporting member 13. For example, the first lead 11 and/or the second lead 12 preferably has a stepped portion (i.e., protrusion) on its lateral surface. Having the stepped portion can increase an joined area between the lead frame 200 and the supporting member 13 that is, for example, formed with a resin. Making the stepped portion fit into the supporting member 13 can increase adhesiveness therebetween. As shown in FIGS. 3A to 3D, the first lead 11 has five projection portions 11p on the lateral surface 11ss. As shown in FIG. 3A, the second lead 12 has two projection portions on the lateral surface 12ss. The five projection portions 11p of the first lead 11 are dispersedly provided on the five sides of the main portion 11a. The two projection portions on the second lead 12 are respectively provided on tips of the extending portion 12a. Depressed portions formed by providing the projection portions 11p are shown in FIGS. 3A to 3D with reference numeral of 11r. Other depressed portions depressed from the surface by respectively forming two projection portions are shown in FIG. 3A with reference numeral 12r. The surface of the lead frame 200 may be plated with, for example, gold, silver, nickel, palladium, or alloy thereof.

1-2. Forming Supporting Member

In a step of forming the supporting member, for example, resin is provided between the first lead 11 and the second lead 12 to form the supporting member 13 that supports the first lead 11 and the second lead 12.

Figure 4A:
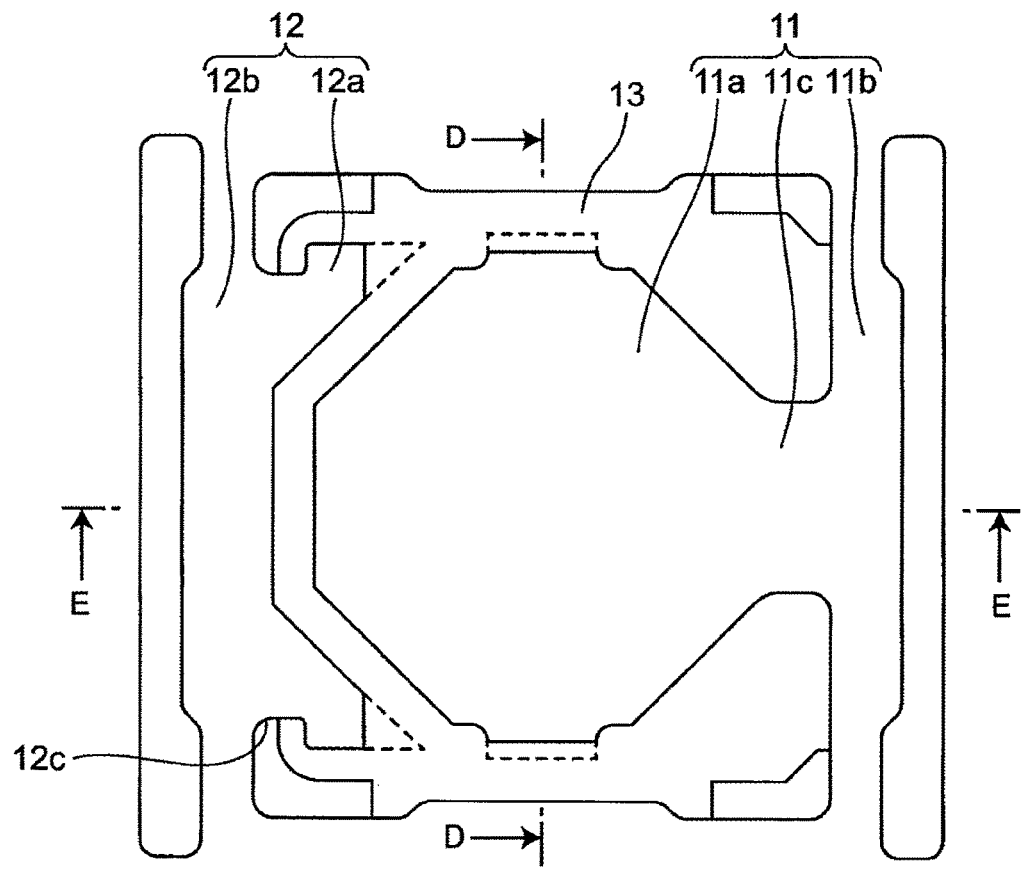
FIG. 4A is a schematic plan view of the unit area after forming supporting member to the lead frame shown in FIG. 2.
Figure 4B:
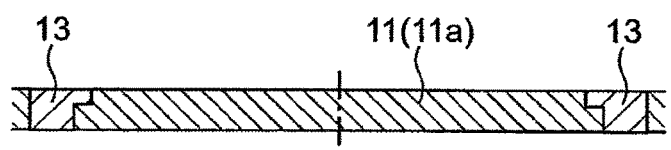
FIG. 4B is a schematic sectional view taken along line D-D of FIG. 4A.
Figure 4C:
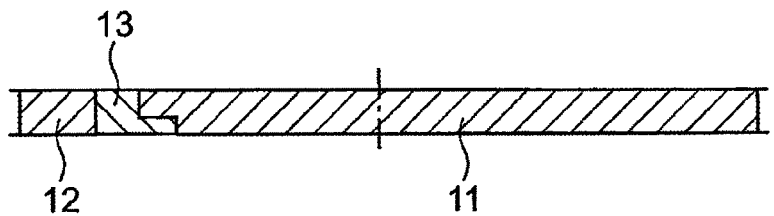
FIG. 4C is a schematic sectional view taken along line E-E of FIG. 4A.

As shown in FIG. 4A, the supporting member 13 is provided to surround the main portion 11a in addition to the first lead 11 and the second lead 12, and to extend on the lateral surfaces at the outer periphery of the two extending portions 12a of the second lead 12 such that the extending portions 12a are supported from its outsides and insides. As shown in FIG. 4A, recesses 12c are respectively formed in regions of the second lead 12 where the extending portions 12a are respectively in contact with the terminal portions 12b in such a manner as to have recesses inward in a top view. Thus, the extending portions 12a can be firmly supported. The depressed portions 12r on the respective tips of the extending portions 12a are covered by the supporting member 13, thereby allowing firm support of the extending portions 12a of the second lead 12.

Examples of resin material used for forming the supporting member 13 include: thermosetting resin such as epoxy resin and silicone resin; and thermoplastic resin such as liquid crystal polymer resin, polyphthalamide resin, polybutylene terephthalate (PBT) resin. The supporting member 13 can be formed by combining a white pigment such as titanium oxide in the base material, to thereby increasing the light reflectivity of the supporting member 13.

Figure 4D:
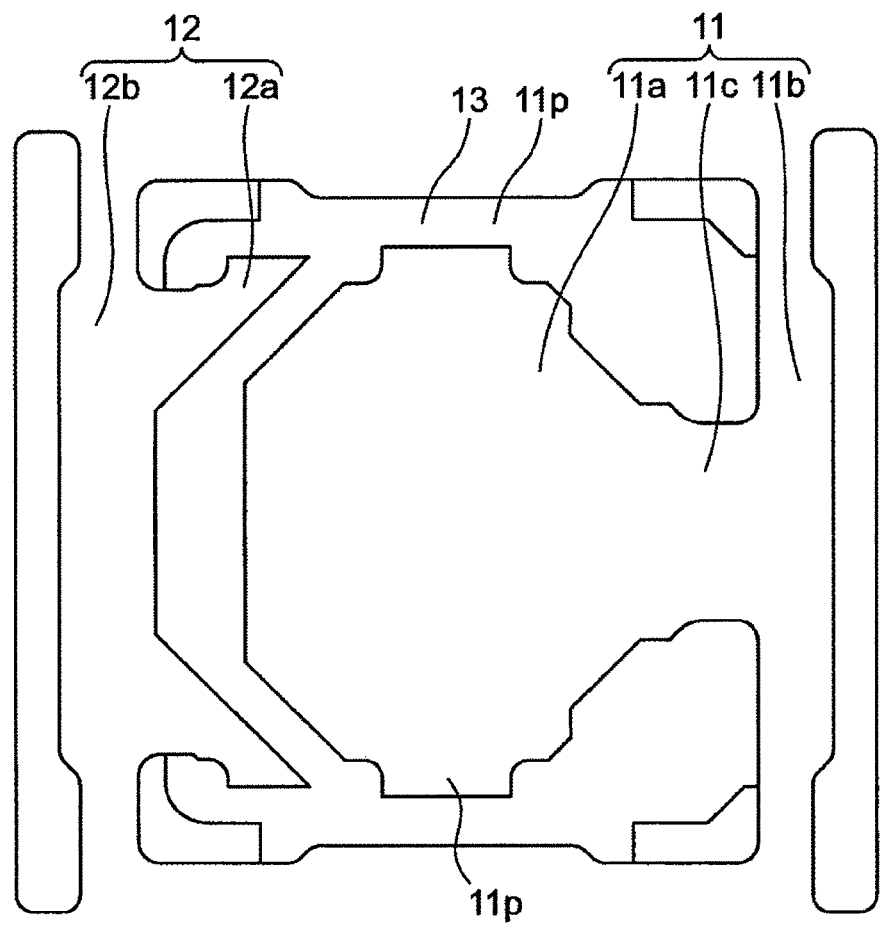
FIG. 4D is a schematic back side plan view of FIG. 4A.

As described above, the plurality of bases 10, each of which configures the unit area 210 having a structure that the first lead 11 and the second lead 12 are electrically isolated to each other by the supporting member 13, are produced. The plurality of bases 10 are produced in a state that the bases 10 are collectively linked to one another. FIG. 4D is a plan view as seen from the lower surface of the base 10 after forming the supporting member 13.

2. Mounting Light Emitting Elements

Figure 5A:
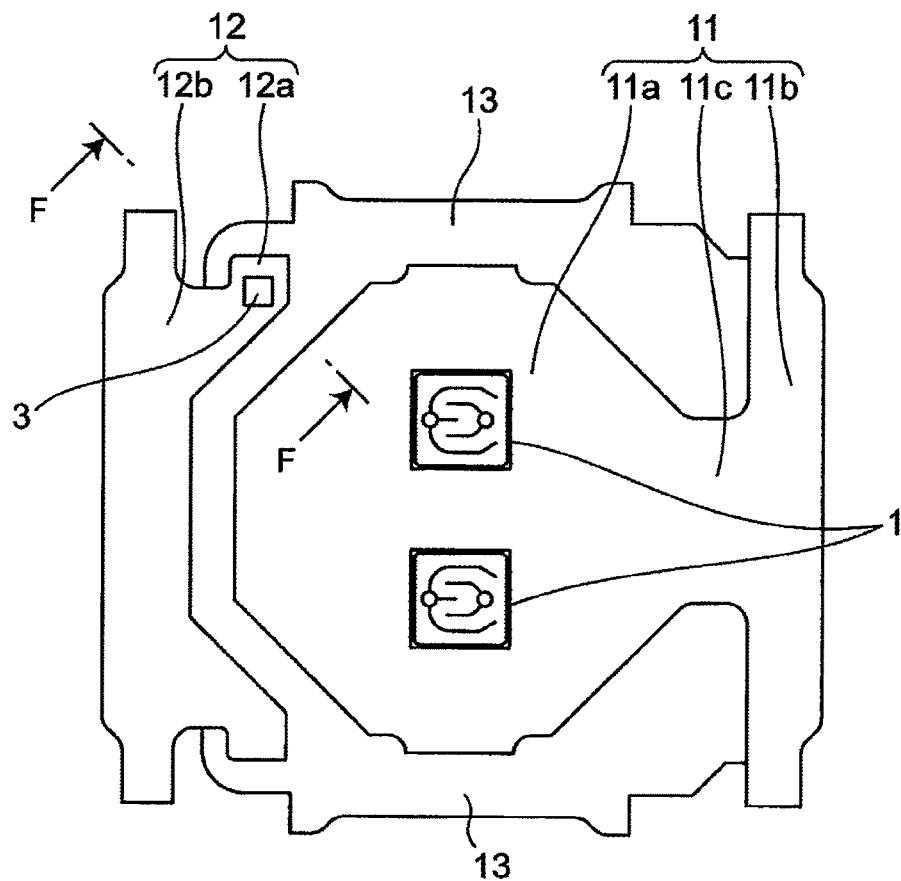
FIG. 5A is a schematic plan view showing the unit area of lead frame with supporting member after light emitting elements 1 and a protection element 3 are mounted thereon.
Figure 5B:
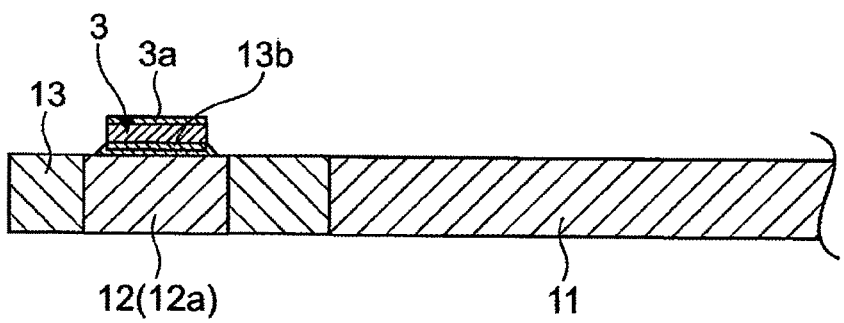
FIG. 5B is a schematic sectional view taken along line F-F of FIG. 5A.

As shown in FIG. 5A, the light emitting elements 1 are mounted and fixed on the predetermined position of the main portion 11a of the first lead 11. The light emitting elements 1 are fixed on, for example, by using silicone resin. As the light emitting elements 1, a known semiconductor light emitting element formed with nitride semiconductor or the like can be employed. A wavelength of the light emitting element can be selected from an ultraviolet range to a infrared range including a visible light range (i.e., 380 nm to 780 nm). For example, a nitride semiconductor can be used as a light emitting element having a peak wavelength in a range of from 430 nm to 490 nm. Examples of the nitride semiconductor include $In_X Al_Y Ga_{1-X-Y} N$ ($0 \leq X$, $0 \leq Y$, $X+Y \leq 1$).

3. Mounting Protection Element

As shown in FIG. 5A, the protection element 3 is mounted and fixed at a predetermined position of the extending portion 12a of the second lead 12. The protection element 3 includes, for example, the terminal electrode 3a (e.g., cathode electrode) on the upper surface and the terminal electrode 3b (e.g., anode electrode) on the lower surface. The terminal electrode 3b (e.g., anode electrode) is fixed on the extending portion 12a with a electrically conductive adhesive 8 formed with, for example, silver-containing epoxy resin such that the terminal electrode 3b (e.g., anode electrode) is brought into electrical conduction with the extending portion 12a.

4. Wiring

In a step of wiring, a predetermined wiring is disposed between the first lead 11 and the second lead 12 by a wire bonding technique. An example of the light emitting device in which the two light emitting elements are mounted is described below.

4-1. Wiring Light Emitting Elements

Figure 6A:
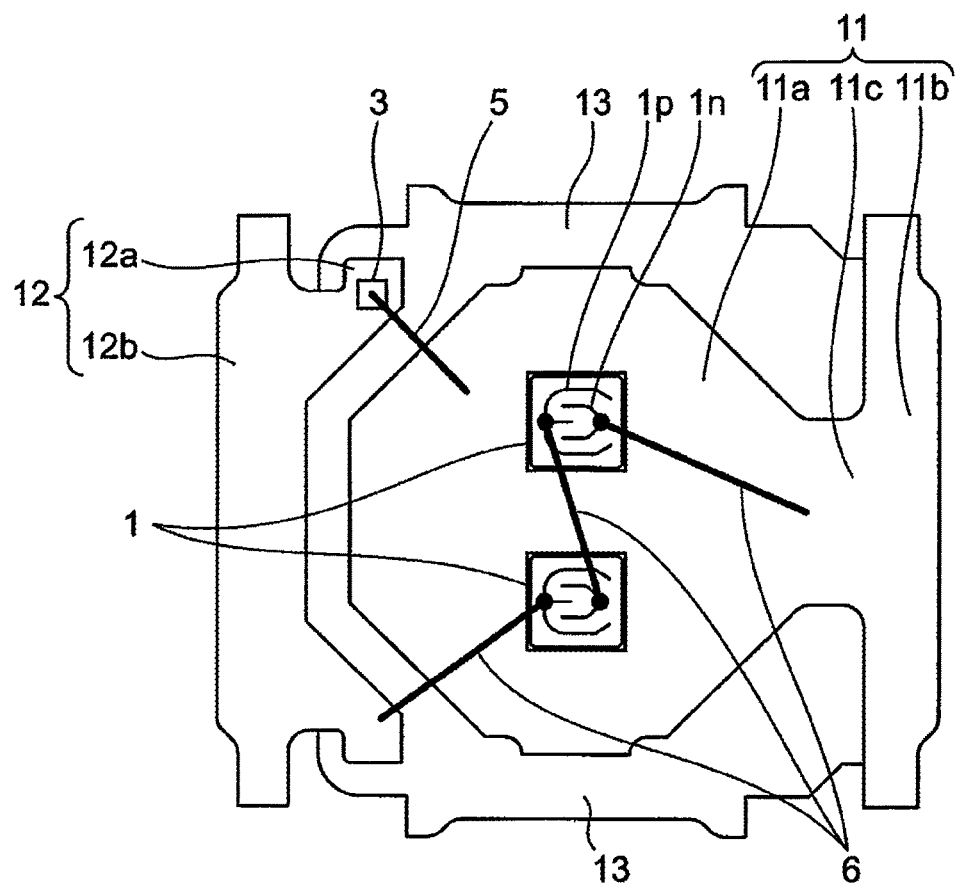
FIG. 6A is a schematic plan view showing a light emitting device after wiring the light emitting elements 1 and the protection element 3.
Figure 6B:
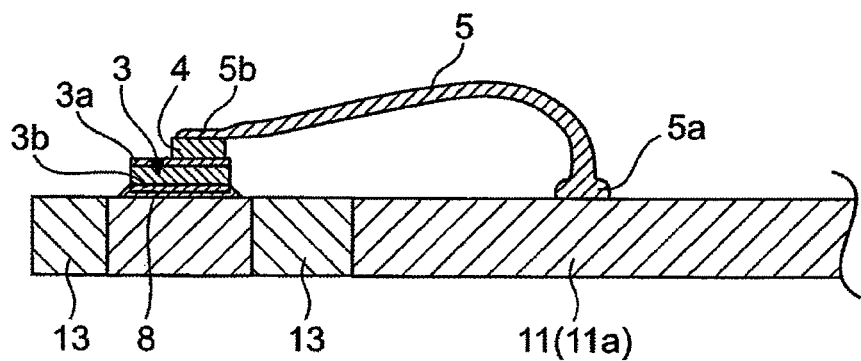
FIG. 6B is a schematic sectional view showing the same part as FIG. 5B after wiring the protection element 3.

As shown in FIG. 6A, wiring light emitting elements includes a first bonding, a second bonding, and a third bonding.

In the first bonding, an n-electrode 1n of one of the two light emitting elements 1 is connected to the first lead 11 (e.g., to boundary or its periphery of the main portion 11a and the connecting portion 11c) via a wire 6.

In the second bonding, a p-electrode 1p of the one of the light emitting elements 1 is connected to an n-electrode 1n of the other one of the light emitting elements 1 via another wire 6.

In the third bonding, a p-electrode 1p of the other one of the light emitting elements 1 is connected to the second lead 12 (e.g., to one of the two extending portions 12a on which the protection element 13 is absent) via yet another wire 6.

The two light emitting elements 1 are serially connected between the first lead 11 and the second lead 12 by the aforementioned first through third bonding.

In the step of wiring the light emitting elements, wire bonding does not necessarily be performed in the aforementioned order. For example, the bonding may be performed in order of the first bonding, the second bonding, and the third bonding, or in order of the third bonding, the second bonding, and the first bonding. As yet another order, the second bonding may come first, and the first bonding followed by the third bonding, or the third bonding followed by the first bonding. As described above, the bonding order is not specifically limited in the step of wiring the light emitting elements. However, bonding of the n-electrodes 1n and the p-electrodes 1p of the light emitting elements is preferably performed by the ball bonding technique. This can reduce stress of load on the light emitting elements 1 in the wire bonding.

4-2. Wiring Protection Element

As shown in FIG. 6A, in a step of wiring protection element, the terminal electrode 3a (e.g., cathode electrode) formed on the upper surface of the protection element 3 that is mounted on the extending portion 12a is connected to the first lead 11 via the wire 5. The first end 5a that is an end of the wire 5 is connected to the first surface 11ms of the first lead 11, and thereafter, the second end 5b that is the other end of the wire 5 is connected to the terminal electrode 3a of the protection element 3.

Specifically, the first end 5a of the wire 5 is connected to the first surface 11ms of the first lead 11 (e.g., to the main portion 11a) by the ball bonding technique. This bonding is referred to as a first bonding. Subsequently, the second end 5b of the wire 5 is connected to the terminal electrode 3a formed on the upper surface of the protection element 3 by the wedge bonding technique. This bonding is referred to as a second bonding. The wedge bonding in the second bonding has an advantage of achieving higher bonding strength compared to the ball bonding. Therefore, good bonding reliability can be achieved even if the protection element 3 is mounted close to the outer edge of the light emitting device. The light emitting device of the present embodiment allows the protection element 3 to be positioned close to the outer edge of the light emitting device. Thus the area for mounting the light emitting elements 1 can be small, thereby enabling downsizing of light emitting device.

As described above, wedge bonding, however, causes more stress of load as compared to the ball bonding. Although the method of manufacturing in the present embodiment employs wedge bonding to connect the wire on the terminal electrode 3a, preferably, the bump 4 is formed on the terminal electrode 3a of the protection element 3 and the second end 5b of the wire 5 is bonded on the bump 4 by wedge bonding in order to reduce the load applied on the protection element 3.

5. Forming Resin Frame

Figure 7A:
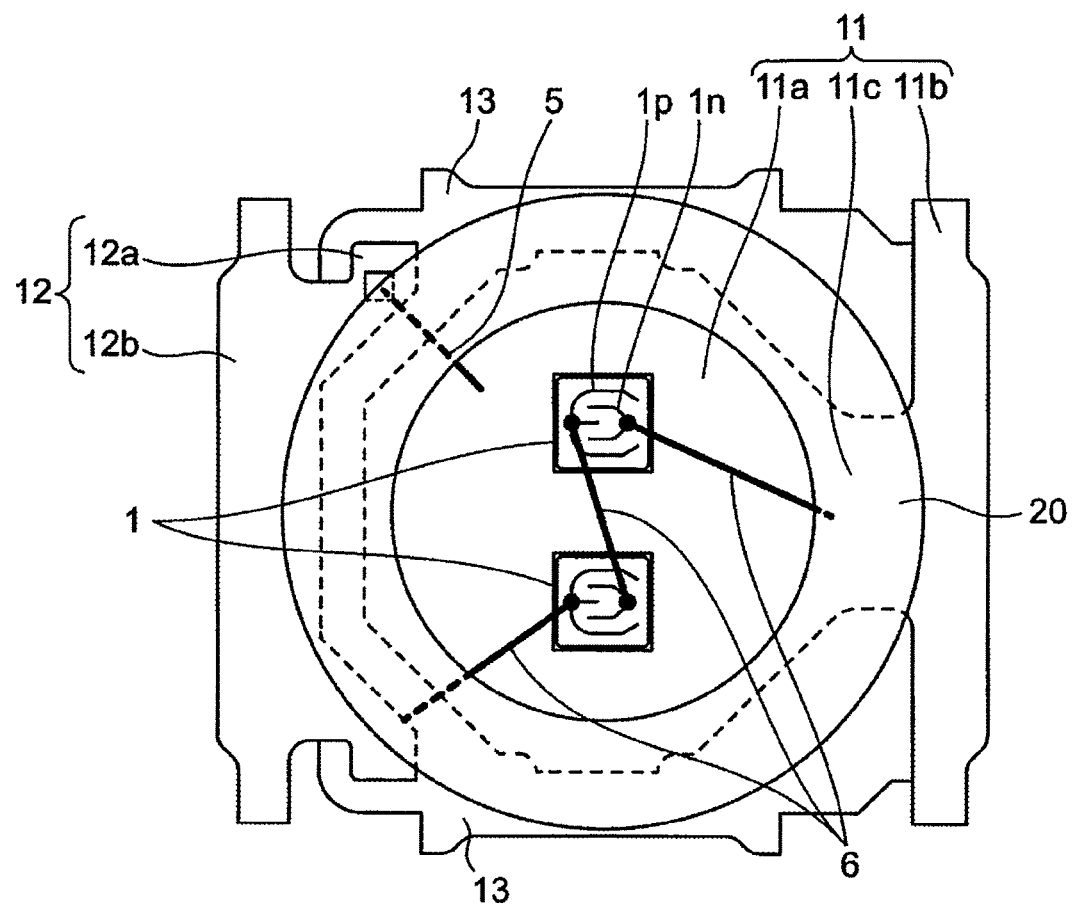
FIG. 7A is a schematic plan view showing the unit area after forming a resin frame 20 to surrounds the light emitting elements 1 and to cover the protection element 3.
Figure 7B:
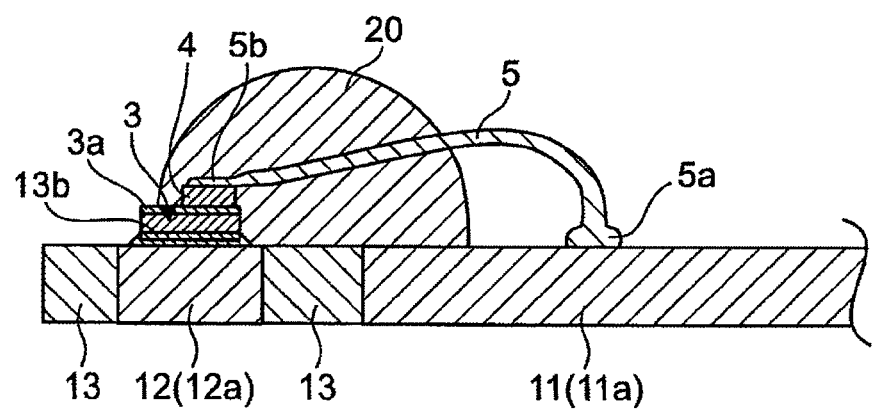
FIG. 7B is a schematic sectional view showing the same part of FIG. 5B after forming the resin frame 20.

As shown in FIG. 7A, in a step of forming resin frame, the resin frame 20 is formed in a circular shape to surround the at least light emitting elements 1 and the first end 5a of the wire 5. The resin frame 20 is formed to surround the light emitting elements 1 and the first end 5a of the wire 5 while being separated from the light emitting elements 1 and the first end 5a of the wire 5. The resin frame 20 is formed in a circular shape, for example, by discharging liquid resin supplied in a dispenser by a constant amount, while moving the dispenser on the main portion 11a at a predetermined distance from the center thereof, following by drying the resin.

The resin frame 20 is formed to embed preferably at least part of the protection element 3, more preferably the second end 5b of the wire 5 serving as a connection portion with the terminal electrode 3a of the protection element 3. This can increase the bonding strength at the connection portion between the terminal electrode 3a of the protection element 3 and the second end 5b of the wire 5. The resin frame 20 is preferably formed to embed the connection portion between the wire 6 (serving as wiring for connecting the light emitting element 1) and the first lead 11, and the connection portion between the wire 6 and the second lead 12. This can increase the bonding strength at the connection portion between the wire 6 and the first lead 11, and the connection portion between the wire 6 and the second lead 12. The resin frame 20 can be formed, for example, in a desired circular shape by adjusting the distance between the center of the main portion 11a and the circumference being apart from the center on which the dispenser moves.

A width of the resin frame 20, which is a distance from an inner edge to the outer edge of the resin frame 20 on the upper surface of the base 10, and a sectional shape such as height of the resin frame 20 can be adjusted by appropriately setting a viscosity and an amount of the resin discharged from the dispenser, and moving speed of the dispenser.

Examples of a material of the resin frame 20 include phenol resin, epoxy resin, BT resin, PPT resin and silicone resin. Among these examples, silicone resin is preferably used for the resin frame 20 due to its good light resistance, and phenyl-based silicone resin is more preferably used. Phenyl-based silicone resin has hardness greater than the hardness of dimethyl-based silicone resin. Thus, the resin frame 20 formed by using phenyl-based silicone resin can alleviate external force applying to, and effectively protect the light emitting elements 1 and the first end 5a of the wire 5 surrounded by the resin frame 20, and the connection portion between the wire 6 and the first lead 11, and the connection portion between the other wire 6 and the second lead 12 embedded in the resin frame 20. A base material of the resin frame 20 preferably contains light reflective material that is less likely to absorb light from the light emitting element 1 and have a great light refraction index relative to the base material. Containing the light reflective material in the resin frame 20 can increase light reflectivity of the resin frame 20 relative to light from the light emitting elements 1, thereby enabling improvement of light extraction efficiency of the light emitting device.

Examples of the light reflective material include titanium oxide, aluminum oxide, zirconium oxide, and magnesium oxide. Among these examples, titanium oxide is preferably used because it is stable against moisture and the like and has a high refractive index. The light reflectivity of the resin frame 20 relative to light from the light emitting elements 1 is preferably 60% or more, or more preferably 70% or more.

6. Forming First Resin Member

Figure 8A:
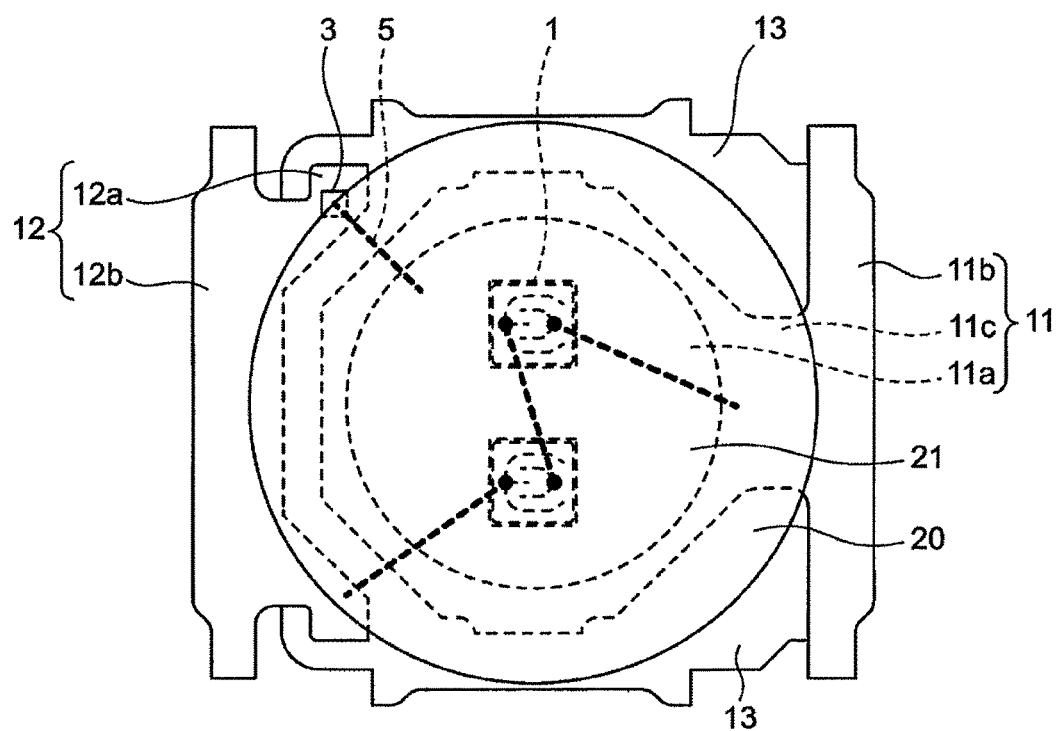
FIG. 8A is a schematic plan view showing the unit area after forming a first resin member 21 inside the resin frame 20.
Figure 8B:
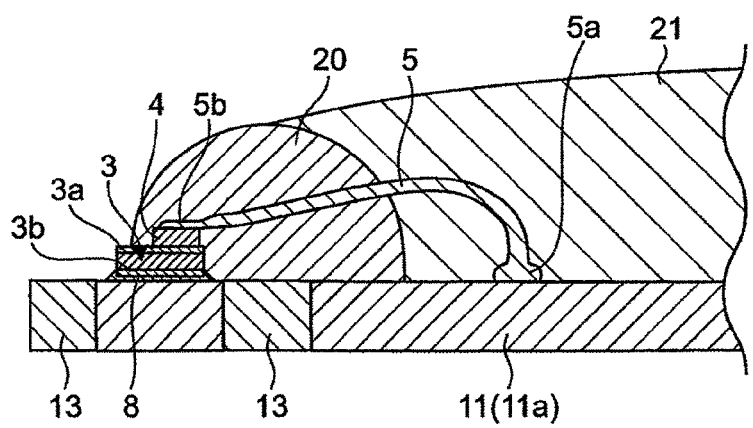
FIG. 8B is a schematic sectional view showing the same part of FIG. 5B after forming the resin part 21.

As shown in FIGS. 8A and 8B, in a step of forming the first resin member, the first resin is provided in an area surrounded by the resin frame 20, and cure the first resin to form the first resin member 21. The first resin member 21 embeds and encapsulates the first light emitting elements 1 and the first end 5a of the wire 5 that are surrounded by the resin frame 20. The first resin 21 is formed, for example, by discharging the first resin to the central portion of the main portion 11a in the resin frame 20 by a dispenser, and cure the first resin. The first resin member 21 can have a shape according to a discharged amount and a viscosity of the first resin by adjusting the amount and the viscosity of the first resin discharged from the dispenser. FIG. 8B is a sectional view showing an example of the first resin member 21 in which the outermost edge of the first resin member 21 coincides with substantially a ridge of the resin frame 20, and a thickness of the first resin member 21 becomes greater toward the center from the outermost edge thereof.

Examples of material of the first resin member 21 include polycarbonate resin, epoxy resin, phenol resin, silicone resin, acryl resin, polymethylpentene resin, polynorbonene resin, modified resin thereof, or hybrid resin containing at least one of the foregoing resins. Among these examples, silicone resin is preferably used, or dimethyl silicone resin is more preferably used for the first resin member 21 because they are good in light resistance. Dimethyl-based silicone resin is soft, in other words, having a lower hardness as compared to phenyl-based silicone resin. However, in the case of using dimethyl-based silicone resin for the first resin member 21, the light emitting elements 1 and the first end 5a of the wire can be sufficiently protected from an external force because the first resin member 21 is surrounded by the resin frame 20 in an effective manner. The first resin member 21 may contain one or more wavelength conversion materials. The wavelength conversion material is a material adapted to convert light having a first peak wavelength emitted from the light emitting elements into light having a second peak wavelength. Adding the wavelength conversion material in the first resin member 21 can output mixed light in which light having the first peak wavelength emitted from the light emitting elements and light having the second peak wavelength emitted from the wavelength conversion material are mixed. For example, a blue LED can be employed for the light emitting element, and a phosphor such as YAG can be employed for the wavelength conversion member.

With this structure, a white light emitting device can be obtained by virtue of mixture of blue light emitted from the blue LED and yellow light generated by that the phosphor is excited by the blue light.

7. Forming Second Resin Member

As shown in FIGS. 1A and 1B, in a step of forming the second resin member, the second resin member 22 is formed to cover the resin frame 20 and the first resin member 21.

The second resin member 22 is, for example, formed in a following manner as shown in FIGS. 1A and 1B:

(a) the terminal portion 11b of the first lead 11 is exposed outside of the second resin member 22 along a side of the light emitting device, while the terminal portion 12b of the second lead 12 is exposed from the second resin member along an opposite side of the terminal portion 11b; and (b) in the case in which the protection element 3 is exposed outside of the resin frame 20, the second resin member 22 covers at least exposed part of the protection element 3, and preferably covers substantially the entire extending portion 12a of the second lead 12.

The second resin member 22 can be formed by transfer molding. Specifically, the an upper mold having a cavity in the shape of the second resin member 22 (e.g., lens shape) is set on the base 10 such that the cavity covers the resin frame 20 and the first resin member 21. A lower mold is set on the lower surface of the base 10, and resin for forming the second resin member 22 into the cavity, followed by curing the resin.

Accordingly, the second resin member 22 can be formed.

The light emitting device can be manufactured according to the above described manufacturing steps.

What is claimed is:

1. A light emitting device comprising:
a base comprising:
    a first lead,
    a second lead, and
    a supporting member that supports the first lead and the second lead, and electrically isolates the first lead from the second lead;
a light emitting element mounted on an upper surface of the first lead;
a protection element mounted on an upper surface of the second lead, the protection element comprising a first terminal electrode and a second terminal electrode;
a wire including a first end and a second end, wherein the first end is connected to the upper surface of the first lead, and the second end is connected to the first terminal electrode of the protection element;
a resin frame located on an upper surface of the base, wherein the resin frame covers at least part of the protection element and surrounds the light emitting element and the first end of the wire;
a first resin member surrounded by the resin frame and covering the light emitting element and the first end of the wire; and
a second resin member covering the resin frame and the first resin member,
wherein part of the protection element is positioned outside the resin frame and covered by the second resin member.

2. The light emitting device according to claim 1, wherein:
a hardness of the resin frame is greater than a hardness of the first resin member and a hardness of the second resin member.

3. The light emitting device according to claim 1, wherein:

the first end of the wire has a ball shape, and a diameter of the ball shape is greater than a diameter of the wire.

4. The light emitting device according to claim 1, wherein:

a width of the second end of the wire is smaller than a diameter of the wire at another portion of the wire, and the second end of the wire is connected to the first terminal electrode via a bump that is located on the terminal electrode.

5. The light emitting device according to claim 1, wherein:

the second end of the wire is embedded in the resin frame.

6. The light emitting device according to claim 1, wherein:

the upper surface of the first lead, the upper surface of the second lead, and an upper surface of the supporting member are substantially flush with one another.

7. The light emitting device according to claim 1, wherein:

the first lead has a lateral surface extending between the upper surface and a lower surface of the first lead, and the lateral surface has a protrusion.

8. The light emitting device according to claim 1, wherein:

the resin frame contains phenyl silicone resin, and the first resin member and the second resin member each contain dimethyl silicone resin.

9. The light emitting device according to claim 1, wherein:

the upper surface of the base positioned inside the resin frame is formed by the upper surface of the first lead.

10. The light emitting device according to claim 1, wherein:

a hardness of the second resin member is greater than a hardness of the first resin member.

11. A method of manufacturing a light emitting device, the method comprising:

providing a base comprising:
- a first lead,
- a second lead, and
- a supporting member that supports the first lead and the second lead, and electrically isolates the first lead from the second lead;

mounting a light emitting element on an upper surface of the first lead;

mounting a protection element on an upper surface of the second lead, the protection element comprising a first terminal electrode and a second terminal electrode;

connecting the protection element and the upper surface of the first lead via a wire so as to connect a first end of the wire to the upper surface of the first lead, and to connect a second end of the wire to the first terminal electrode of the protection element disposing a resin frame to surround the light emitting element and the first end of the wire while being apart from the light emitting element and the first end of the wire, the resin frame being disposed such that part of the protection element is positioned outside the resin frame, disposing a first resin member to cover the light emitting element and the first end of the wire, and disposing a second resin member to cover the resin frame, the first resin member, and the part of the protection element positioned outside the resin frame.

12. The method of manufacturing a light emitting device according to claim 11, wherein:

in the step of connecting the protection element and the upper surface of the first lead via the wire, the first end of the wire is connected to the upper surface of the first lead, and thereafter the second end of the wire is connected to the first terminal electrode of the protection element.

* * * * *